(12) United States Patent
Escamilla et al.

(10) Patent No.: US 12,379,754 B2
(45) Date of Patent: Aug. 5, 2025

(54) AIR MOVER ASSEMBLY

(71) Applicant: Dell Products L.P., Round Rock, TX (US)

(72) Inventors: Eduardo Escamilla, Round Rock, TX (US); Juan M. Gonzalez, Round Rock, TX (US); Matthew Dang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 210 days.

(21) Appl. No.: 18/447,695

(22) Filed: Aug. 10, 2023

(65) Prior Publication Data

US 2025/0053213 A1 Feb. 13, 2025

(51) Int. Cl.
*G06F 1/20* (2006.01)
*H05K 5/00* (2025.01)
*H05K 7/20* (2006.01)

(52) U.S. Cl.
CPC ............ *G06F 1/206* (2013.01); *H05K 5/006* (2013.01); *H05K 7/20172* (2013.01)

(58) Field of Classification Search
CPC . G06F 1/20; G06F 1/206; G06F 1/183; G06F 2200/201; G06F 1/182; G06F 1/16; G06F 1/181; H05K 7/20172; H05K 5/006; H05K 7/20727; H05K 7/20145; H05K 7/20136; H05K 7/1491; H05K 7/20; H05K 7/20209; H05K 7/20554; H05K 7/20736; H05K 5/0208; H05K 1/0201; H05K 7/20154; H05K 7/20581; H05K 1/0203; H05K 1/0209; H05K 7/2019; F04D 19/002; F04D 25/0693; F04D 29/646; F04D 19/007; F04D 25/08; F04D 25/166; F04D 29/281; F04D 29/38; F04D 29/4226; F04D 29/626
See application file for complete search history.

(56) References Cited

U.S. PATENT DOCUMENTS

| | | | | |
|---|---|---|---|---|
| 6,109,890 | A * | 8/2000 | Horng | F04D 29/626 417/423.15 |
| 6,414,845 | B2 * | 7/2002 | Bonet | H05K 7/20581 312/236 |
| 6,653,802 | B1 * | 11/2003 | Nelson | H05K 7/1461 361/752 |
| 6,795,314 | B1 * | 9/2004 | Arbogast | H05K 7/20172 165/122 |
| 6,851,925 | B2 * | 2/2005 | Chuang | F04D 29/601 415/126 |
| 7,522,415 | B2 * | 4/2009 | Fan | H05K 7/20172 312/236 |
| 8,385,064 | B1 * | 2/2013 | Smith | H05K 7/20727 361/679.48 |

(Continued)

*Primary Examiner* — Michael A Matey
(74) *Attorney, Agent, or Firm* — Jackson Walker L.L.P.

(57) ABSTRACT

An air mover assembly may include an air mover, a circuit board electrically coupled to the air mover via a plurality of electrical wires, a housing configured to house the circuit board and including hard stops configured to mechanically engage with side edges of the circuit board to retain the circuit board in a fixed position relative to the housing, and a cover configured to mechanically engage with the housing such that the cover and the housing at least partially enclose the circuit board.

6 Claims, 3 Drawing Sheets

(56) References Cited

U.S. PATENT DOCUMENTS

| | | | |
|---|---|---|---|
| 11,758,686 B1* | 9/2023 | Tunks | H05K 7/20172 |
| | | | 361/679.48 |
| 2004/0256334 A1* | 12/2004 | Chen | H05K 7/20727 |
| | | | 211/41.17 |
| 2008/0068789 A1* | 3/2008 | Pav | H05K 7/20172 |
| | | | 361/679.48 |
| 2008/0182501 A1* | 7/2008 | Yang | H05K 7/20172 |
| | | | 454/184 |
| 2008/0219838 A1* | 9/2008 | Kusano | F01D 1/02 |
| | | | 415/203 |
| 2008/0239665 A1* | 10/2008 | Franz | F04D 29/664 |
| | | | 417/423.15 |
| 2009/0168400 A1* | 7/2009 | Liu | F21V 33/0096 |
| | | | 362/96 |
| 2011/0176273 A1* | 7/2011 | Olsen | H05K 7/2039 |
| | | | 361/679.49 |
| 2013/0100613 A1* | 4/2013 | Nakai | H05K 7/20563 |
| | | | 415/213.1 |
| 2013/0337735 A1* | 12/2013 | Peterson | F04D 29/582 |
| | | | 29/428 |
| 2014/0029191 A1* | 1/2014 | Terwilliger | H05K 7/20172 |
| | | | 415/213.1 |
| 2019/0069442 A1* | 2/2019 | Pav | G06F 1/20 |
| 2021/0325851 A1* | 10/2021 | Lambert | G06F 8/65 |
| 2022/0043491 A1* | 2/2022 | Huang | G06F 1/20 |
| 2022/0046815 A1* | 2/2022 | Chen | F04D 25/0693 |
| 2023/0112501 A1* | 4/2023 | Karuppiah | H05K 7/20727 |
| | | | 702/22 |
| 2023/0284372 A1* | 9/2023 | Laurent | G06F 1/203 |
| | | | 361/694 |
| 2023/0301031 A1* | 9/2023 | Geng | H05K 1/09 |
| 2024/0134425 A1* | 4/2024 | Curtis | G06F 1/20 |

* cited by examiner

AIR MOVER ASSEMBLY

TECHNICAL FIELD

The present disclosure relates in general to information handling systems, and more particularly to an air mover assembly for use in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Over time, information handling systems have become more densely packed with components, permitting only limited space for air movers and the carriers/assemblies that house such air movers, and presenting challenges in assembling and retaining such carriers in an information handling system, as well as challenges in supporting electrical interconnect used to power and/or provide control signals to the air movers.

SUMMARY

In accordance with the teachings of the present disclosure, the disadvantages and problems associated with traditional approaches to mounting air movers in an information handling system may be substantially reduced or eliminated.

In accordance with embodiments of the present disclosure, an information handling system may include a chassis and an air mover assembly mechanically coupled to the chassis and comprising an air mover, a circuit board electrically coupled to the air mover via a plurality of electrical wires, a housing configured to house the circuit board and including hard stops configured to mechanically engage with side edges of the circuit board to retain the circuit board in a fixed position relative to the housing, and a cover configured to mechanically engage with the housing such that the cover and the housing at least partially enclose the circuit board.

In accordance with these and other embodiments of the present disclosure, an air mover assembly may include an air mover, a circuit board electrically coupled to the air mover via a plurality of electrical wires, a housing configured to house the circuit board and including hard stops configured to mechanically engage with side edges of the circuit board to retain the circuit board in a fixed position relative to the housing, and a cover configured to mechanically engage with the housing such that the cover and the housing at least partially enclose the circuit board.

In accordance with these and other embodiments of the present disclosure, a method may include electrically coupling a circuit board to an air mover via a plurality of electrical wires, housing the circuit board in a housing including hard stops configured to mechanically engage with side edges of the circuit board to retain the circuit board in a fixed position relative to the housing; and mechanically engaging a cover with the housing such that the cover and the housing at least partially enclose the circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
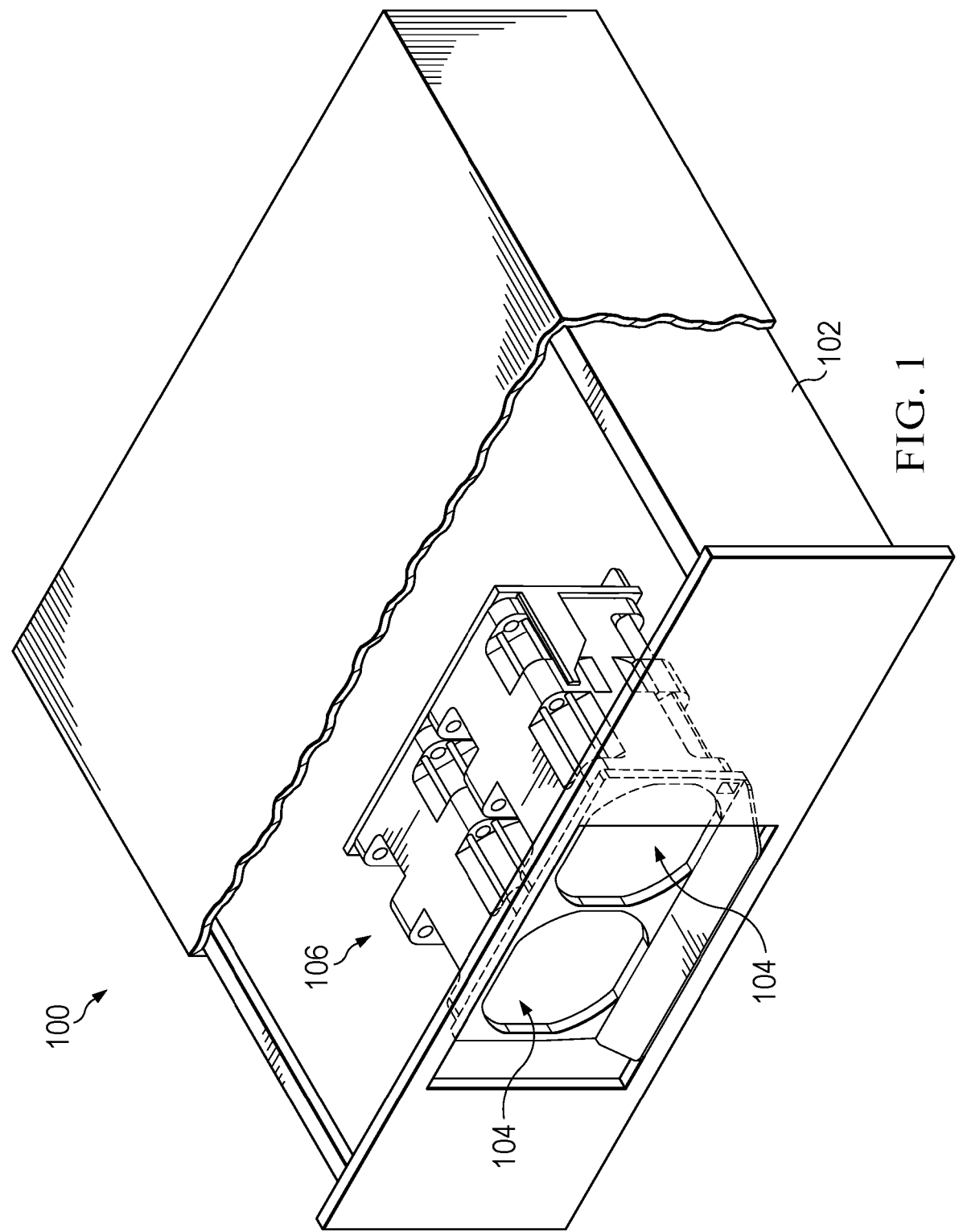
FIG. 1 illustrates an example information handling system having an air mover assembly housing a plurality of air movers for cooling information handling resources, in accordance with the present disclosure.
Figure 2:
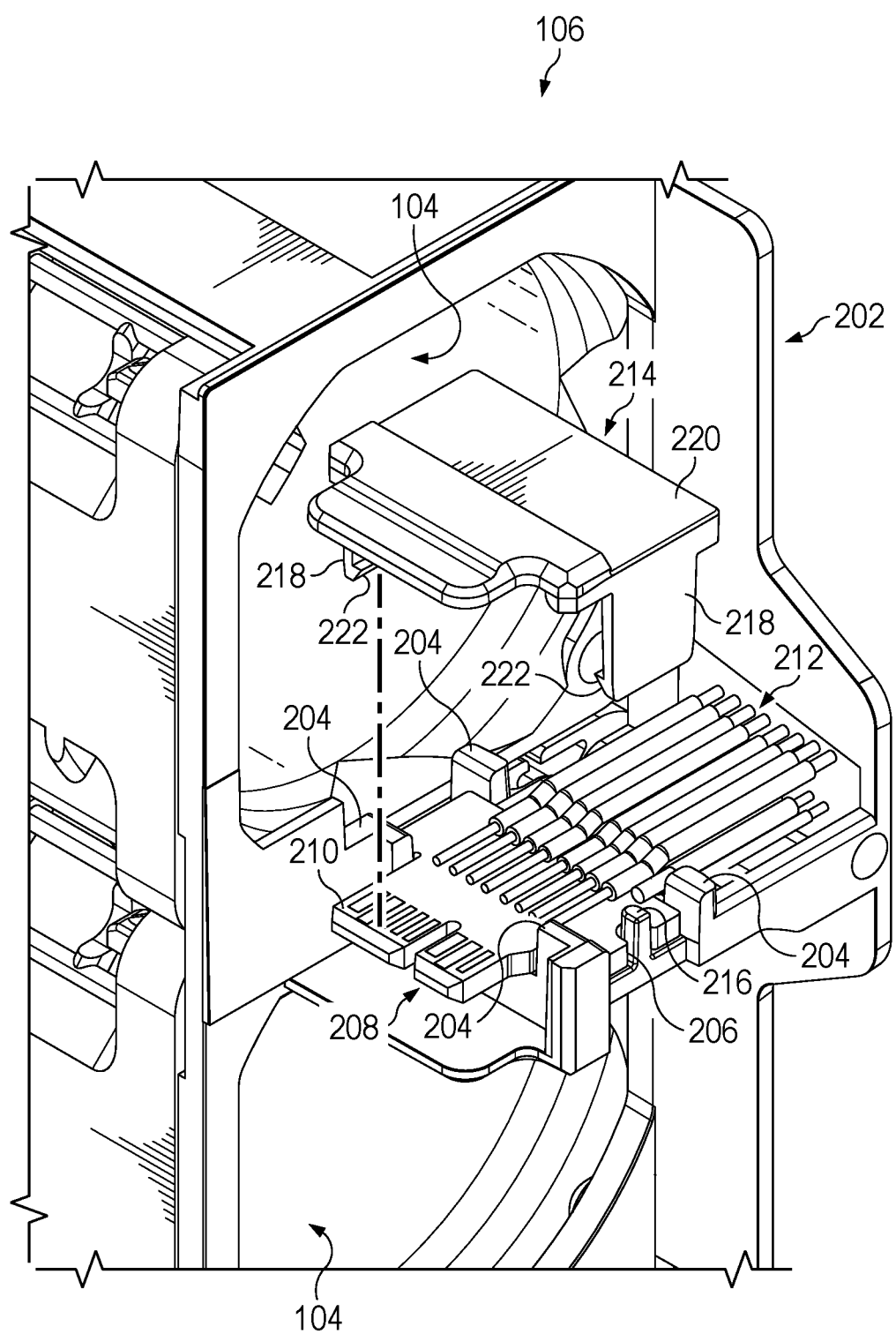
FIG. 2 illustrates a perspective view of an air mover assembly including features for supporting electrical interconnect of the air mover assembly, in accordance with the present disclosure.
Figure 3:
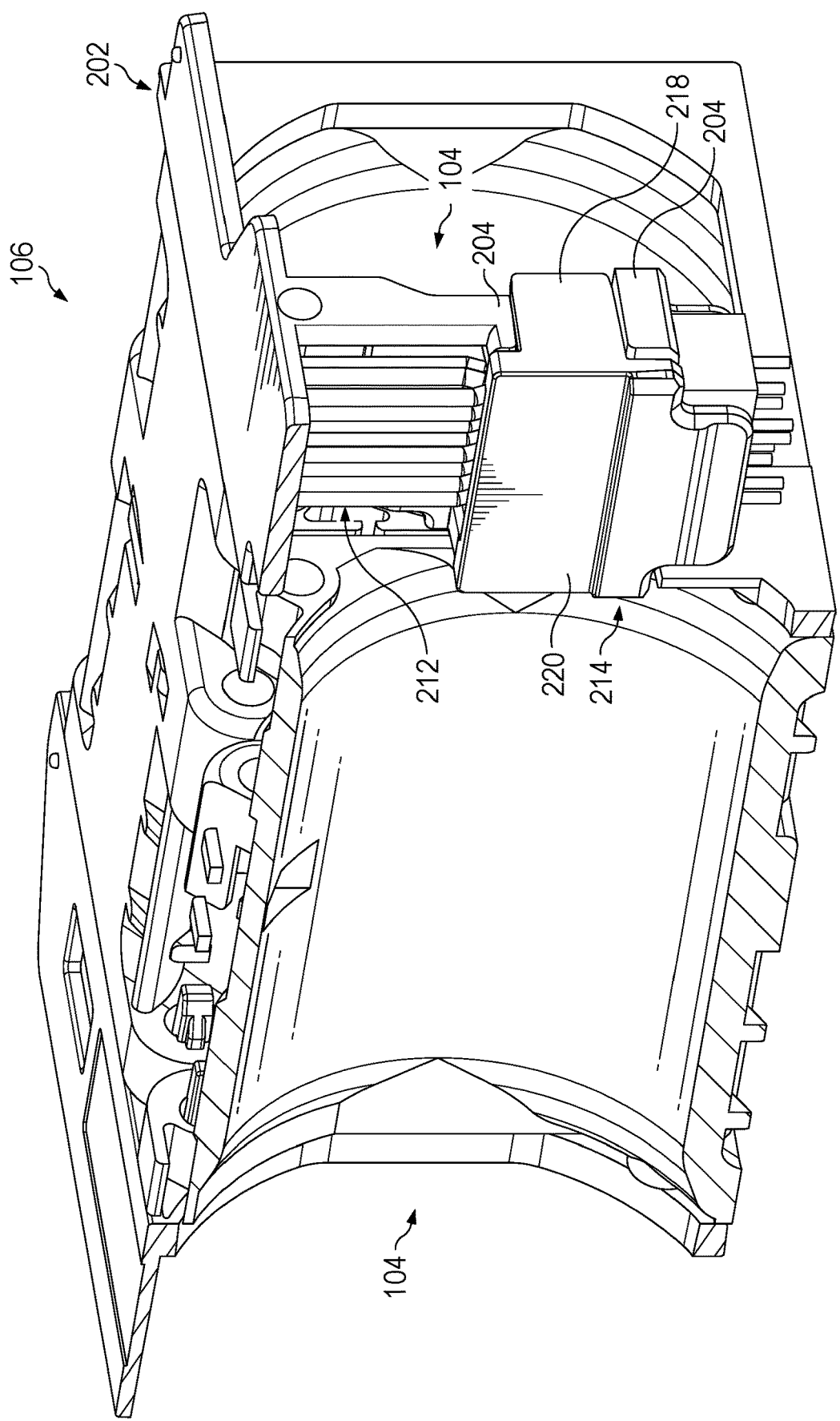
FIG. 3 illustrates another perspective view of the air mover assembly of FIG. 2, in accordance with the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates an example information handling system 100 having an air mover assembly 106 housing a plurality of air movers 104 for cooling information handling resources, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having an air mover assembly 106 which may be configured to house a plurality of air movers 104. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of air movers 104 may be any mechanical or electro-mechanical system, apparatus, or device operable to move air and/or other gases. In certain embodiments, air movers 104 may draw cool air into chassis 102 from the outside, expel warm air from inside chassis 102, and/or move air across one or more heatsinks (not explicitly shown) internal to chassis 102 to cool one or more information handling resources of information handling system 100.

Air mover assembly 106 may comprise any suitable system, device, or apparatus configured to house air movers 104 and electrical interconnect (not explicitly shown in FIG. 1) for providing power and control signals to air movers 104 (e.g., from a motherboard to which the electrical interconnect is coupled). In some embodiments, air mover assembly 106 may be configured to be easily inserted into and removed from chassis 102, including being configured to enable a blind mate of the electrical interconnect to a corresponding connector of a motherboard during insertion into chassis 102. The structure and function of air mover assembly 106 may be described in greater detail below.

Although information handling system 100 is depicted as including one air mover assembly 106, information handling system 100 may include any number of air mover assemblies 106. In addition, although a particular configuration of air mover assembly 106 is depicted, air mover assembly 106 may be configured in any suitable manner consistent with the present disclosure.

FIG. 2 illustrates a perspective view of air mover assembly 106 including features for supporting electrical interconnect of air mover assembly 106, in accordance with the present disclosure. As shown in FIG. 2, air mover assembly 106 may include a housing 202, a cover 214, a plurality of air movers 104, and electrical interconnect including a circuit board 208 with an edge connector 210 and a plurality of electrical wires 212 electrically and mechanically coupled to circuit board 208.

As shown in FIG. 2, housing 202 may include any suitable mechanical structure configured (e.g., sized and shaped) to house air movers 104, circuit board 208, and wires 212, as described in greater detail below. Housing 202 may be constructed from metal, plastic, and/or any other suitable material.

As depicted in FIG. 2, housing 202 may have a number of mechanical features configured for retaining circuit board 208 in a fixed position relative to housing 202 in order to ensure proper alignment of edge connector 210 to enable blind mating of edge connector 210 to a corresponding connector of a motherboard when air mover assembly 106 is inserted into chassis 102. For example, housing 202 may include a plurality of hard stops 204 shaped (e.g., in the shape of rectangular prisms) and positioned relative to one another such that each hard stop 204 may mechanically engage with a side edge of circuit board 208 in order to maintain circuit board 208 in a fixed position relative to housing 202, and preventing circuit board 208 from moving relative to housing 202 during insertion and removal of edge connector 210 into its corresponding connector on a motherboard of information handling system 100. As another example, housing 202 may have formed therein a keying feature 206 configured to mechanically engage with a corresponding keying feature 216 of circuit board 208 to ensure circuit board 208 is properly inserted into housing 202 in the correct orientation. Such mechanical features of housing 202 (e.g., hard stops 202 and keying feature 206) and circuit board 208 (e.g., side edges, keying feature 216), may allow circuit board 208 to lay in place within housing 202 while minimizing the needed lengths of electrical wires 212.

Circuit board 208 may comprise any suitable circuit board for conveying electrical energy (e.g., from a motherboard via edge connector 210) to air movers 104 via electrical wires 212 and/or carrying signals (e.g., control signals for air movers 104, telemetry signals from air movers 104) to and/or from air movers 104 (e.g., to and/or from a motherboard via edge connector 210) via electrical wires 212.

Edge connector 210 may comprise any suitable electrical connector configured to electrically and mechanically couple to a corresponding receptacle connector, for example a receptacle connector mounted to a motherboard of information handling system 100.

Each of wires 212 may be electrically coupled between circuit board 208 and an air mover 104 and configured to convey electrical energy or electrical/electronic signals.

For purposes of clarity and exposition, cover 214 is shown in FIG. 2 as disassembled from housing 202. Cover 214 may be constructed from metal, plastic, and/or any other suitable material, and may be configured (e.g., sized and shaped) to mechanically engage with housing 202 such that when cover 214 is mechanically engaged with housing 202, at least a portion of circuit board 208 is enclosed by housing 202 and cover 214. For example, as shown in FIG. 2, cover 214 may have a top 220 and opposing side flanges 218 extending perpendicularly from top 220, such that top 220, side flanges 218, and a feature of housing 202 fully enclose at least a portion of circuit board 208 when cover 214 is mechanically engaged with housing 202. As another example, cover 214 may have engagement features 222 (e.g., spring loaded hooks at the ends of side flanges 218) configured to engage with housing 202 to hold cover 214 in place after being mechanically engaged with housing 202. Cover 214, when engaged with housing 202, may further maintain circuit board 208 in a fixed position relative to housing 202 in addition to hard stops 204 and keying feature 206 maintaining circuit board 208 in the fixed position.

In some embodiments, mechanical damping material (e.g., foam) may be inserted between circuit board 208 and cover 214 to provide mechanical damping for vibration and/or other mechanical events and/or to further secure circuit board 208 in a fixed position relative to housing 202.

For additional exposition, FIG. 3 depicts air mover assembly 104 in a different perspective view than that of FIG. 2, and with cover 214 mechanically engaged with housing 202 to enclose circuit board 208, in accordance with embodiments of the present disclosure.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a chassis; and
   an air mover assembly mechanically coupled to the chassis and comprising:
      an air mover;
      a circuit board electrically coupled to the air mover via a plurality of electrical wires;
      a housing configured to house the circuit board and including hard stops configured to mechanically engage with side edges of the circuit board to retain the circuit board in a fixed position relative to the housing; and
      a cover configured to mechanically engage with the housing such that the cover and the housing at least partially enclose the circuit board.

2. The information handling system of claim 1, wherein:
   the housing further comprises a first keying feature; and
   the circuit board further comprises a second keying feature configured to mechanically engage with the housing to ensure the circuit board is properly inserted into the housing in a correct orientation.

3. An air mover assembly comprising:
   an air mover;
   a circuit board electrically coupled to the air mover via a plurality of electrical wires;
   a housing configured to house the circuit board and including hard stops configured to mechanically engage with side edges of the circuit board to retain the circuit board in a fixed position relative to the housing; and a cover configured to mechanically engage with the housing such that the cover and the housing at least partially enclose the circuit board.

4. The air mover assembly of claim 3, wherein:
the housing further comprises a first keying feature; and
the circuit board further comprises a second keying feature configured to mechanically engage with the housing to ensure the circuit board is properly inserted into the housing in a correct orientation.

5. A method comprising:
electrically coupling a circuit board to an air mover via a plurality of electrical wires;
housing the circuit board in a housing including hard stops configured to mechanically engage with side edges of the circuit board to retain the circuit board in a fixed position relative to the housing; and
mechanically engaging a cover with the housing such that the cover and the housing at least partially enclose the circuit board.

6. The method of claim 5, further comprising mechanically engaging a first keying feature of the housing to a second keying feature of the circuit board to ensure the circuit board is properly inserted into the housing in a correct orientation.

* * * * *